United States Patent
Saigal et al.

(10) Patent No.: US 6,579,783 B2
(45) Date of Patent: Jun. 17, 2003

(54) METHOD FOR HIGH TEMPERATURE METAL DEPOSITION FOR REDUCING LATERAL SILICIDATION

(75) Inventors: Dinesh Saigal, San Jose, CA (US); Shuk Ying Lai, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/900,759

(22) Filed: Jul. 6, 2001

(65) Prior Publication Data

US 2002/0019119 A1 Feb. 14, 2002

Related U.S. Application Data

(60) Provisional application No. 60/216,905, filed on Jul. 7, 2000.

(51) Int. Cl.$^7$ ................................................ H01L 21/44
(52) U.S. Cl. ...................... 438/581; 438/583; 438/586
(58) Field of Search .............................. 438/581, 533, 438/558, 586, 655, 656, 664, 682, 683, 301

(56) References Cited

U.S. PATENT DOCUMENTS

| | | | |
|---|---|---|---|
| 5,122,923 A | 6/1992 | Matsubara et al. | 361/321 |
| 5,252,807 A | 10/1993 | Chizinsky | 219/390 |
| 5,335,138 A | 8/1994 | Sandhu et al. | 361/303 |
| 5,723,367 A * | 3/1998 | Wada et al. | 438/660 |
| 5,780,361 A | 7/1998 | Inoue | 438/683 |
| 5,814,852 A | 9/1998 | Sandhu et al. | 257/310 |
| 5,838,035 A | 11/1998 | Ramesh | 257/295 |
| 5,851,896 A | 12/1998 | Summerfelt | 438/396 |
| 5,874,342 A * | 2/1999 | Tsai et al. | 438/586 |
| 5,902,129 A | 5/1999 | Yoshikawa et al. | 438/592 |
| 5,936,831 A | 8/1999 | Kola et al. | 361/303 |
| 5,970,370 A * | 10/1999 | Besser et al. | 438/301 |
| 6,165,807 A | 12/2000 | Lee et al. | 438/18 |
| 6,171,922 B1 | 1/2001 | Maghsoudnia | 438/385 |
| 6,179,983 B1 | 1/2001 | Reid et al. | 205/96 |
| 6,218,716 B1 | 4/2001 | Wang et al. | 257/413 |
| 6,221,766 B1 | 4/2001 | Wasserman | 438/656 |
| 6,225,176 B1 | 5/2001 | Yu | 438/305 |
| 6,365,516 B1 * | 4/2002 | Frenkel et al. | 438/682 |

OTHER PUBLICATIONS

Byun, et al. "Effect of Deposition Temperature and Sputtering Ambient on In Situ Cobalt Silicide Formation", *J. Electrochem. Soc.*, 144(9) (Sep. 1997), pp. 3175–3179.

Inoue, et al., "A New Cobalt Salicide Technology for 0.15–$\mu$m CMOS Devices", *IEEE Transactions on Electron Devices* 45(11) (Nov. 1998), pp. 2312–2318.

U.S. patent application Ser. No. 09/748,072, Narwankan et al., filed Dec. 21, 2000.

* cited by examiner

*Primary Examiner*—David Nelms
*Assistant Examiner*—Dung Anh Le
(74) *Attorney, Agent, or Firm*—Moser, Patterson & Sheridan LLP

(57) ABSTRACT

Embodiments of the present invention generally relate to processes of making an improved salicide-gate. One embodiment of a method for forming a feature on a substrate comprises forming a gate structure on a substrate; forming spacers by the sidewalls of the gate; and depositing a relatively thin metal film, such as cobalt or titanium, over the gate at a high temperature.

33 Claims, 6 Drawing Sheets

METHOD FOR HIGH TEMPERATURE METAL DEPOSITION FOR REDUCING LATERAL SILICIDATION

CROSS-REFERENCE TO RELATED APPLICATIONS

This application claims benefit of U.S. provisional patent application Ser. No. 60/216,905, filed Jul. 7, 2000, which is herein incorporated by reference.

BACKGROUND OF THE INVENTION

1. Field of the Invention

The present invention relates to an improved salicide process useful in the manufacture of integrated circuits and other electronic devices.

2. Background of the Related Art

One process for constructing integrated circuits uses self-aligned silicide (salicide) technology to form contacts for metal oxide semiconductors (MOS). A conventional salicide process involves the steps of depositing a metal film over a MOS structure under processing conditions which result in the reaction of the metal with exposed silicon areas of a source/drain region and of a polysilicon gate to form silicide contacts.

FIGS. 1A–H are schematic cross-sectional views of a substrate illustrating one conventional salicide process. In such a process, as shown in FIG. 1A, a field oxide layer 10 is deposited on a substrate 12. Then, as shown in FIG. 1B, the field oxide layer 10 is patterned and etched and a gate oxide layer 14 is formed on the substrate 12. Then, as shown in FIG. 1C, a polysilicon layer 16 is formed on the gate oxide layer 14. The polysilicon layer 16 and the gate oxide layer 14 are patterned to form a gate 18. A lightly doping process is performed and the gate 18 acts as a mask to form a lightly doped region 20. Then, as shown in FIG. 1D, a dielectric layer 22, such as silicon dioxide ($SiO_2$), silicon nitride (SiN), or silicon oxynitride (SiON), is deposited over the gate 18. Then, as shown in FIG. 1E, the dielectric layer 22 is anisotropically etched to form insulating sidewall spacers 24 flanking the gate 18 and leaving the exposed source/drain regions 26. Ion implantation is performed using spacers 24 as a mask to more heavily dope the source/drain regions 26. Then, as shown in FIG. 1F, a reactive metal 28, such as cobalt (Co) or titanium (Ti), is deposited on the structure by chemical vapor deposition or physical vapor deposition. A first anneal causes the metal 28 to react primarily with the exposed silicon regions to form a metal silicide 30 that exists initially as a high resistivity phase silicide. In the reaction of the metal 28 with the exposed silicon regions, metal diffuses into the exposed silicon regions and silicon diffuses to the metal layer 28. Then, as shown in FIG. 1G, the unreacted metal is etched away leaving the metal silicide 30. A second anneal forms the desired low resistivity phase of the silicide 30. Then, as shown in FIG. 1H, after deposition of a passivation layer 32, opening of the contacts 34, and metallization of the contacts 34, the final structure of the salicide process is formed.

However, as shown in FIG. 2, which is a schematic cross-sectional view of a silicide formation over a polysilicon gate, a problem with the salicide process is lateral formation of the silicide on the sides of the gate structure. If a continuous layer of silicide 30 is formed between the polysilicon gate 16 and the source/drain regions 26, a short can occur which can render the device useless. The spacers 24 are formed to prevent silicide from forming on the edge of the polysilicon gate 16. The spacers 24 are made of materials which do not react with the metal 28 deposited during the silicide process and thus, provide electrical isolation of the polysilicon gate 16 from the source/drain regions 26. However, because of diffusion 40 of silicon atoms from the polysilicon gate 16 and the source/drain regions 26, a silicide layer 30 can be formed over the spacers 24 and can bridge the separation of the polysilicon gate 16 and the source/drain regions 26. Silicide formation easily bridges the spacers 24 since spacers are typically only 2000 to 3000 Angstroms wide. The problem of silicide formation occurs more readily as the length of the polysilicon gate shrinks with each process node.

FIG. 3 is a schematic cross-sectional view of a substrate showing a low temperature deposition of a metal 28 over the polysilicon gate 16 and the source/drain regions 26 in a conventional salicide process. The metal 28, such as cobalt (Co) or titanium (Ti), is deposited over the polysilicon gate 16 and source/drain regions 26 by chemical vapor deposition (CVD) or physical vapor deposition (PVD). Generally, during deposition of the metal, the substrate is maintained at a low temperature (i.e. at about 100° C.) to prevent silicide formation during the deposition step and to prevent greater material coverage of the spacers 24 through the increased surface mobility of the metal 28. Material coverage of the spacers 24 increases the likelihood that silicide will form over the spacers 24 during the first annealing step. As a consequence, physical vapor deposition of the metal is preferred because chemical vapor deposition generally provides improved material coverage of the spacers 24 and, in addition, is generally more expensive than physical vapor deposition. However, metals sputtered from a PVD source, with the material flux from the sputtering source following a cosine type distribution ($J = A_o \cos\phi \cos\theta$), still provides the undesirable effect of having good material coverage over the spacer 24. Thus, deposition of metal 28 at low temperatures still provides a continuous layer of metal 28 over the spacers 24. As a consequence, the formation of a continuous layer of metal over the spacers 24 increases the likelihood of the formation of a continuous layer of silicide forming over the spacers 24 during the first annealing step.

Therefore, there is a need for an improved salicide gate and a process of making an improved salicide gate which reduces the likelihood of lateral silicide formation.

SUMMARY OF THE INVENTION

The present invention generally relates to an improved salicide gate and process of making an improved salicide gate. One embodiment of the process comprises forming a gate structure on a substrate; forming spacers by the sidewalls of the gate; and depositing a relatively thin metal film, such as cobalt or titanium, over the gate at temperatures of about 350° C. or higher. In one aspect of the invention, the metal film agglomerates and forms a discontinuous film over the dielectric spacers. Thus, lateral silicidation over the spacers is prevented because silicon cannot diffuse through the discontinuous metal film layer over the spacers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
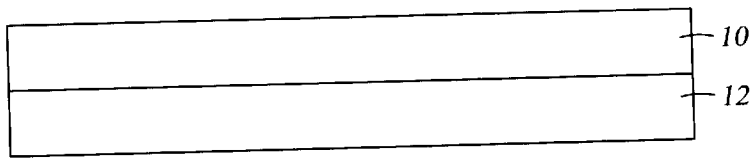
FIGS. 1A–1H are schematic cross-sectional views of a substrate showing a conventional salicide process.
Figure 1B:
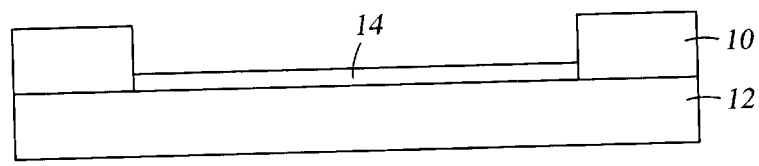
Figure 1C:
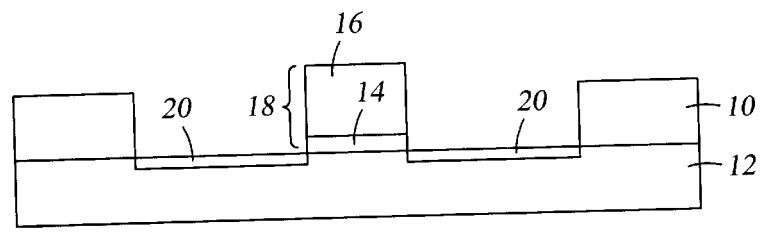
Figure 1D:
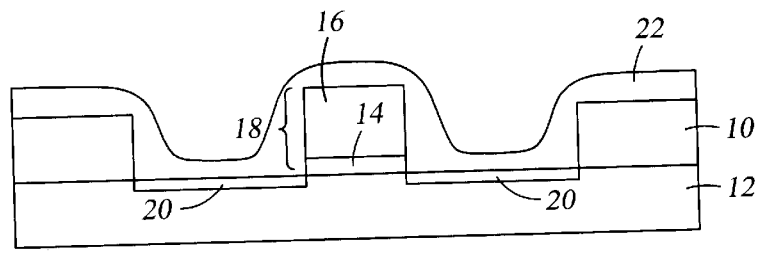
Figure 1E:
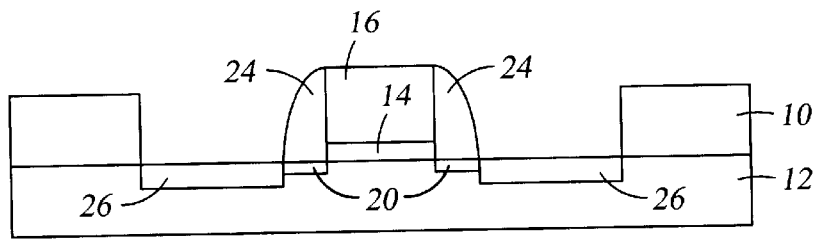
Figure 1F:
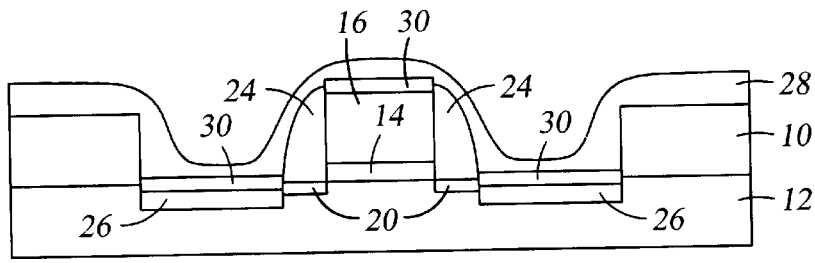
Figure 1G:
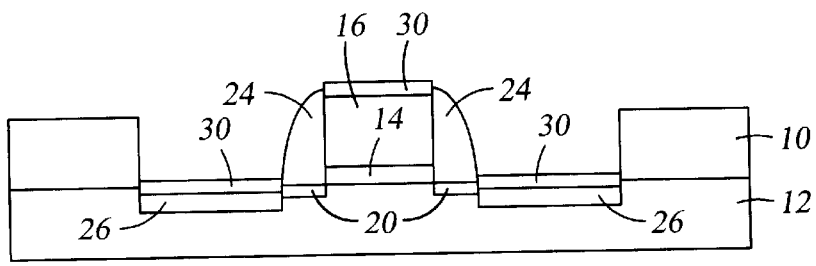
Figure 1H:
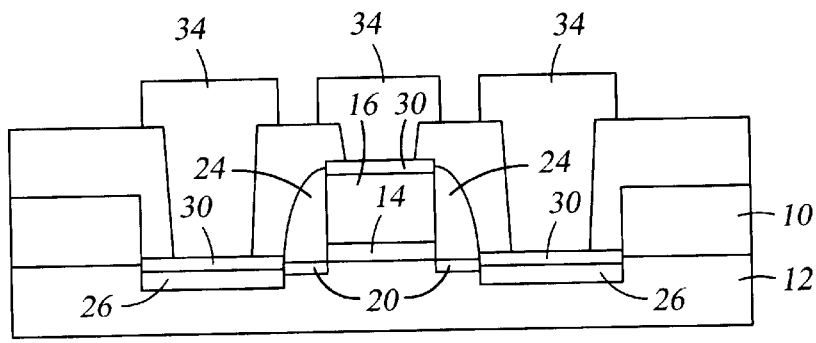
Figure 2:
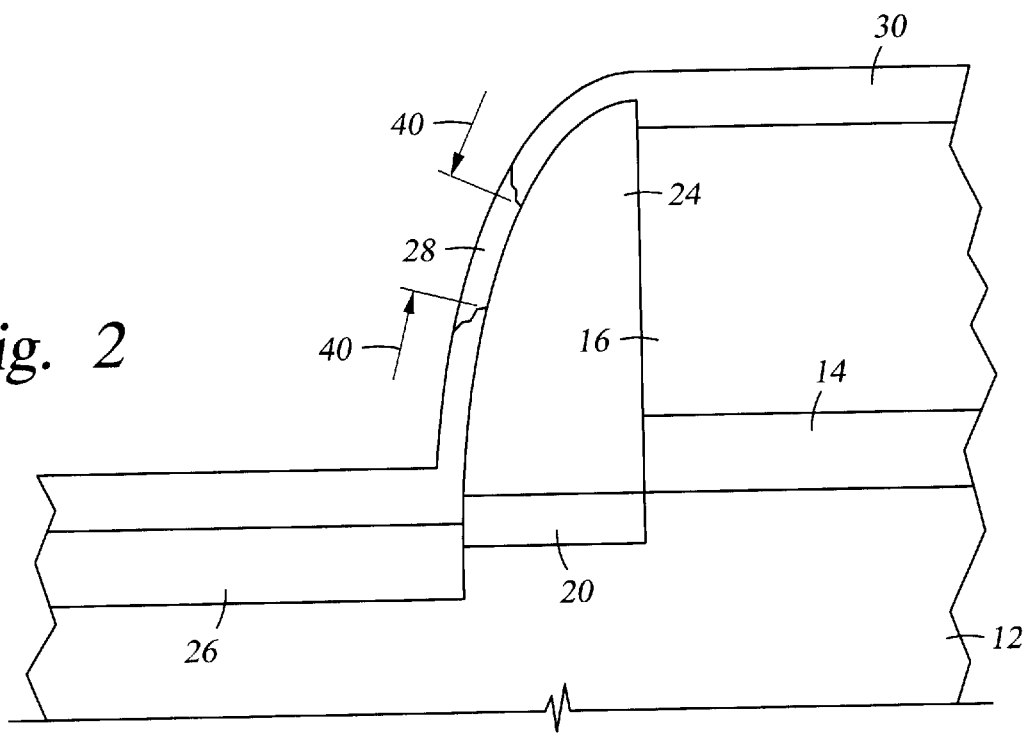
FIG. 2 is a schematic cross-sectional view of lateral silicidation of a polysilicon gate.
Figure 3:
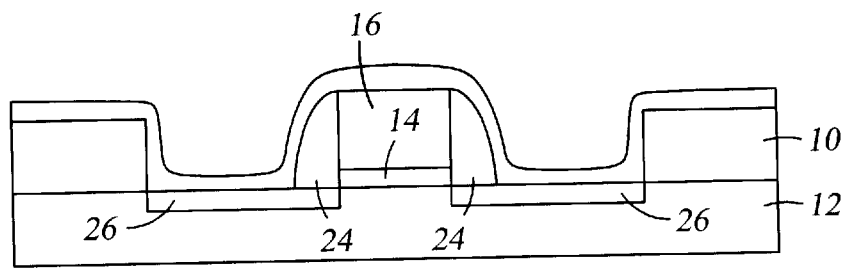
FIG. 3 is a schematic cross-sectional view of a substrate showing a low temperature deposition of a metal over the polysilicon gate in the conventional salicide process of FIG. 1.
Figure 4:
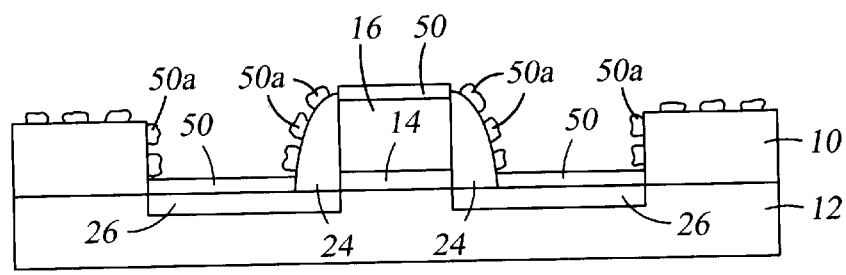
FIG. 4 is a schematic cross-sectional view of a substrate showing a high temperature deposition of a metal over the polysilicon gate according to one embodiment of the present invention.

A method according to one embodiment of the invention represents an improvement in the salicide process. FIG. 4 is a schematic cross-sectional view of a substrate showing a high temperature deposition of a metal over the polysilicon gate and the source/drain. A reactive metal 50 is deposited over the polysilicon gate 16 and the source/drain regions 26 at a high temperature utilizing deposition techniques such as PVD or CVD techniques, preferably PVD techniques are used. The reactive metal 50 is preferably cobalt (Co) or titanium (Ti), most preferably Co. However, the reactive metal 50 can also be molybdenum (Mo), palladium (Pd), platinum (Pt), tantalum (Ta), and tungsten (W) or combinations thereof. The reactive metal is deposited at a high temperature of about 350° C. or higher, of about 400° C. or higher, of about 450° C. or higher, or of about 500° C. or higher. When the metal 50 is deposited at high temperatures, the metal tends to form metal agglomerates 50a on dielectric materials such as on the dielectric spacers 24 and on the field oxide layer 10. Since the metal deposition thickness is rather thin, the metal film 50 does not have an opportunity to coalesce and become continuous over dielectric materials. In one embodiment, the metal film 50 is deposited to a thickness having the lower limits of about 50 Angstroms or about 90 Angstroms to the upper limits of about 150 Angstroms, about 200 Angstroms, or about 250 Angstroms, with a range from any lower limit to any upper limit being within the scope of the present invention. One range of the thickness of the deposited metal film 50 is from about 50 Angstroms to about 150 Angstroms. Another range of the thickness of the deposited metal film 50 is from about 90 Angstroms to about 185 Angstroms.

Because the metal 50 is discontinuous over the spacers, lateral silicidation is prevented because there is no path for silicon diffusion through the metal 50 over the spacers 24. The agglomeration of the metal when deposited at high temperatures does not have any adverse effect on silicidation on the top of the polysilicon gate 16 or the source/drain regions 26 because the metal does not agglomerate on bare silicon but in fact reacts with the silicon at high temperatures to form a silicide in-situ. A selectiveetch, such as a selective wet etch, following the first annealing step in the process will remove the unreacted metal 50 from the spacers 24 and isolation regions which has not formed a metal silicde.

Figure 5:
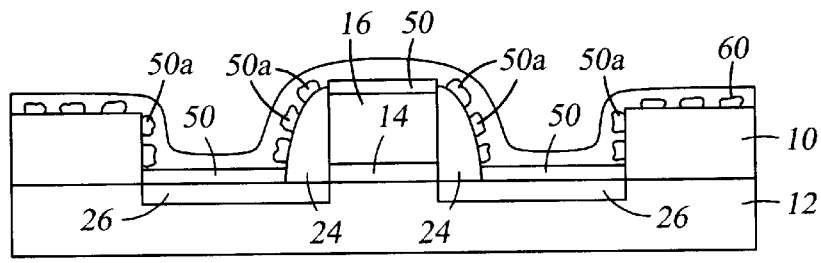
FIG. 5 shows a schematic cross-sectional view of a capping layer deposited over the substrate of FIG. 4.

As shown in FIG. 5, after the metal is deposited and prior to the selective wet etch, an optional capping layer 60 may be deposited over the metal film 50. For example, the capping layer 60 may comprise a titanium/titanium nitride layer over the metal film 50. In one aspect, the capping layer 60 may be deposited by PVD or CVD techniques, preferably PVD techniques are used. It is believed that the capping layer 60 protects the underlying metal film 50 from exposure to oxygen-containing gases prior to the first annealing step.

Figure 6:
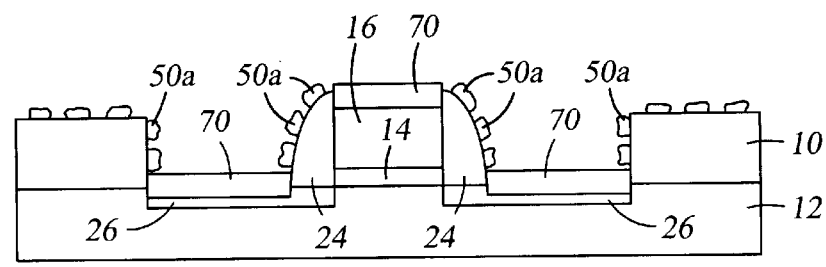
FIG. 6 shows a schematic cross-sectional view of the substrate of FIG. 4 after a first annealing step.

As shown in FIG. 6, which is a schematic cross-sectional view of a substrate without a capping layer, a first annealing step is performed to cause the metal film 50 to react with the exposed silicon regions to form a metal silicide 70. For example, the first annealing step may comprise a rapid thermal process (RTP) anneal conducted at about 450° C. to about 500° C. for a time period of about 30 to about 60 seconds. The first annealing step may be performed in the same or in a separate chamber in which the metal film 50 is deposited. Because the metal film 50 is discontinuous over the spacers 24, lateral silicidation is prevented because there is no path for silicon diffusion through the metal 50 over the spacers 24. Therefore, the metal silicide 70 is prevented from forming over the spacers 24.

The agglomeration and discontinuity of the metal film on the spacers are evident when trying to measure the sheet resistance of Co. For example, when Co is deposited to a thickness of about 180 Angstroms on a dielectric material of silicon dioxide at a low temperature of about 100° C., the sheet resistance of the Co is about 9.75 ohms/square. When Co is deposited to a thickness of about 180 Angstroms on a dielectric material of silicon dioxide at a high temperature of about 500° C., the sheet resistance of the Co cannot be measured indicating a highly resistive discontinuous film. Furthermore, scanning electron microscopy photographs of Co films with a thickness of about 185 Angstroms deposited on a dielectric material of silicon dioxide at a low temperature of about 100° C. and at a high temperature of about 500° C. showed that Co films were continuous and smooth when deposited at a low temperature of about 100° C. and were discontinuous when deposited at a high temperature of about 500° C.

Figure 7:
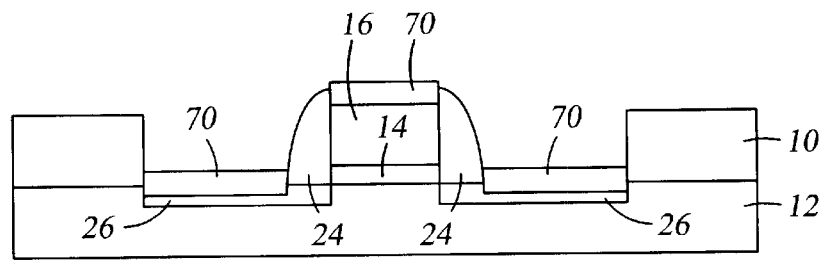
FIG. 7 shows a schematic cross-sectional view of the substrate of FIG. 6 after a selective etch.

As shown in FIG. 7, following the first annealing step, a selective etch, such as a dry etch or a wet-etch, is performed to remove the metal agglomerates 50a and the excess metal 50 which has not reacted with the underlying silicon. Preferably, a selective wet-etch is performed. One example of a wet-etch solution for the removal of excess metal of cobalt comprises hydrogen peroxide and sulfuric acid. One example of a wet-etch solution for the removal of excess metal of titanium comprises hydrogen peroxide and ammonium hydroxide. If a capping layer 60 is deposited over the metal 50, a selective etch is also performed to remove the capping layer 60.

After the selective etch, a second anneal step, such as a RTP anneal, is performed at a temperature of at least about 700° C. to form the low resistivity phase of the silicide. After the second anneal, the silicide film has a thickness of about three times the deposition thickness of the metal.

Figure 8:
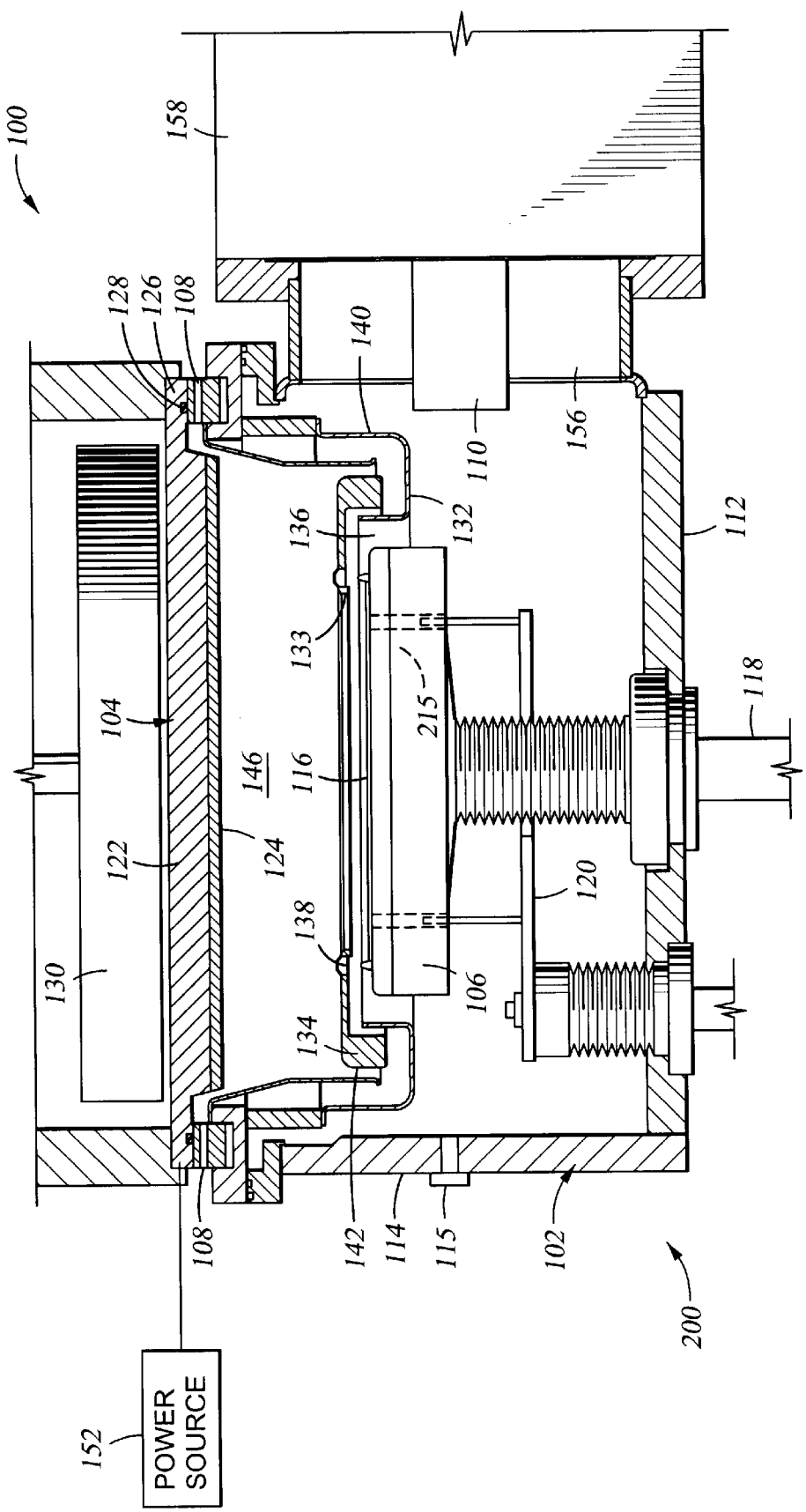
FIG. 8 shows a schematic cross-sectional view of one embodiment of a physical vapor deposition chamber in which the metal deposition may be performed.

In one embodiment, the deposition of the metal film 50 may be performed in a PVD chamber, such as a conventional hot aluminum deposition PVD chamber available from Applied Materials, Inc. of Santa Clara, Calif. FIG. 8 shows one embodiment of a PVD chamber 100 in which the metal deposition may be performed. The PVD chamber 100 generally comprises a chamber enclosure 102, a target 104, a substrate support 106, a gas inlet 108 and a gas exhaust 110. The chamber enclosure 102 includes a chamber bottom 112 and a chamber side wall 114. A slit valve 115 is disposed on a chamber side wall 114 to facilitate transfer of a substrate 116 into and out of the PVD chamber 100. The substrate support 106 is disposed on a substrate support lift assembly 118 through the chamber bottom 112. Typically, a temperature control element (not shown), such as a heater, is incorporated within the substrate support 106 to control the temperature of the substrate 116 during processing. The substrate support lift assembly 118 moves the substrate support 106 vertically between a substrate transfer position and a substrate processing position. A lift pin assembly 120 lifts the substrate 116 off the substrate support 106 to facilitate transfer of the substrate 116 between the chamber and a robot blade (not shown) used to transfer the substrate into and out of the chamber.

The target 104 is disposed in the top portion of the chamber enclosure 102. Preferably, the target 104 is positioned directly above the substrate support 106. The target 104 generally comprises a backing plate 122 supporting a plate of sputterable material 124. The chamber may be adapted to perform reactive sputtering in which the sputtered material reacts with other materials or gases in the process cavity to form the deposited film. The backing plate 122 includes a flange portion 126 that is secured to the chamber enclosure 102. Preferably, a seal 128, such as an O-ring, is provided between the flange portion 126 of the backing plate 122 and the chamber enclosure 102 to establish and maintain a vacuum environment in the chamber during processing. A magnet assembly 130 is disposed above the backing plate 122 to provide magnetic field enhancement that attracts ions from the plasma toward the target sputtering surface to enhance sputtering of the target material.

A lower shield 132 is disposed in the chamber to shield the interior surfaces of the chamber enclosure 102 from deposition. The lower shield 132 extends from the upper portion of the chamber side wall 114 to a peripheral edge of the substrate support 106 in the processing position. A clamp ring 134 may be used and is removeably disposed on an inner terminus 136 of the lower shield 132. When the substrate support 106 moves into the processing position, the inner terminus 136 surrounds the substrate support 106, and a peripheral portion 138 of the substrate 116 engages an inner terminus 133 of the clamp ring 134 and lifts the clamp ring 134 off the inner terminus 136 of the lower shield 132. The clamp ring 134 serves to clamp or hold the substrate 116 as well as shield the peripheral portion 138 of the substrate 116 during the deposition process. Alternatively, instead of a clamp ring 134, a shield cover ring (not shown) is disposed above an inner terminus of the lower shield. When the substrate support moves into the processing position, the inner terminus of the shield cover ring is positioned immediately above the peripheral portion of the substrate to shield the peripheral portion of the substrate from deposition.

Preferably, an upper shield 140 is disposed within an upper portion of the lower shield 132 and extends from the upper portion of the chamber side wall 114 to a peripheral edge 142 of the clamp ring 134. Preferably, the upper shield 140 comprises a material that is similar to the materials that comprise the target, such as aluminum, titanium and other metals. The upper shield 140 is preferably a floating-ground upper shield that provides an increased ionization of the plasma compared to a grounded upper shield. The increased ionization provides more ions to impact the target 104 leading to a greater deposition rate because of the increased sputtering from the target 104. Alternatively, the upper shield 140 can be grounded during the deposition process.

A gas inlet 108 disposed at the top portion of the chamber enclosure 102 between the target 104 and the upper shield 140 introduces a processing gas into a process cavity 146. The process cavity 146 is defined by the target 104, the substrate 116 disposed on the substrate support 106 in the processing position and the upper shield 140. Typically, argon is introduced through the gas inlet 108 as the process gas source for the plasma. A gas exhaust 110 is disposed on the chamber side wall 114 to evacuate the chamber prior to the deposition process, as well as control the chamber pressure during the deposition process. Preferably, the gas exhaust 110 includes an exhaust valve 156 and an exhaust pump 158. The exhaust valve 156 controls the conductance between the interior of the chamber 100 and the exhaust pump 158.

To supply a bias to the target 104, a power source 152 is electrically connected to the target 104. The power source 152 may be a DC power supply coupled to the target 104. An RF power supply may also be used as well. The power source 152 supplies the energy to the process cavity to strike and maintain a plasma of the processing gas in the process cavity during the deposition process.

A gas exhaust 110 is disposed on the chamber side wall 114 to evacuate the chamber prior to the deposition process, as well as control the chamber pressure during the deposition process. Preferably, the gas exhaust 110 includes an exhaust valve 156 and an exhaust pump 158. The exhaust valve 156 controls the conductance between the interior of the chamber 100 and the exhaust pump 158. The exhaust pump 158 preferably comprises a turbomolecular pump in conjunction with a cryopump to minimize the pump down time of the chamber. Alternatively, the exhaust pump 158 comprises a low pressure, a high pressure pump or a combination of low pressure and high pressure pumps.

In depositing the metal film, the operating pressure of the PVD chamber is about 3 to about 5 mTorr. The substrate is heated to a temperature of about 350° C. or higher, of about 400° C. or higher, of about 450° C. or higher, or of about 500° C. or higher, or at any temperature which will cause agglomeration of the metal when deposited on a dielectric material. The heater that is used can be any heater, preferably a heated pedestal is used which is capable of providing high temperature with good uniformity to the substrate. One example of a chamber having a heated pedestal capable of providing high temperature with good uniformity is a HTHU (high temperature, high uniformity) chamber which has a pedestal adapted to provide a heated gas to the backside of a substrate, available from Applied Materials, Inc. of Santa Clara, Calif. In one aspect, to improve heat transfer between the substrate and a heated pedestal, a substrate chuck may be used. For example, a clamp ring may mechanically hold the substrate against the heater. In another example, an electrostatic chuck may be used to electrically hold the substrate, such as a MCA™ electrostatic ceramic chuck available from Applied Materials, Inc., of Santa Clara, Calif.

During the deposition of the metal, the power applied to the target is typically in the range of about 300 to about 800 watts, depending on the size of the target, with the deposition time being about 13 seconds for the deposition of a 175 Angstrom film.

Figure 9:
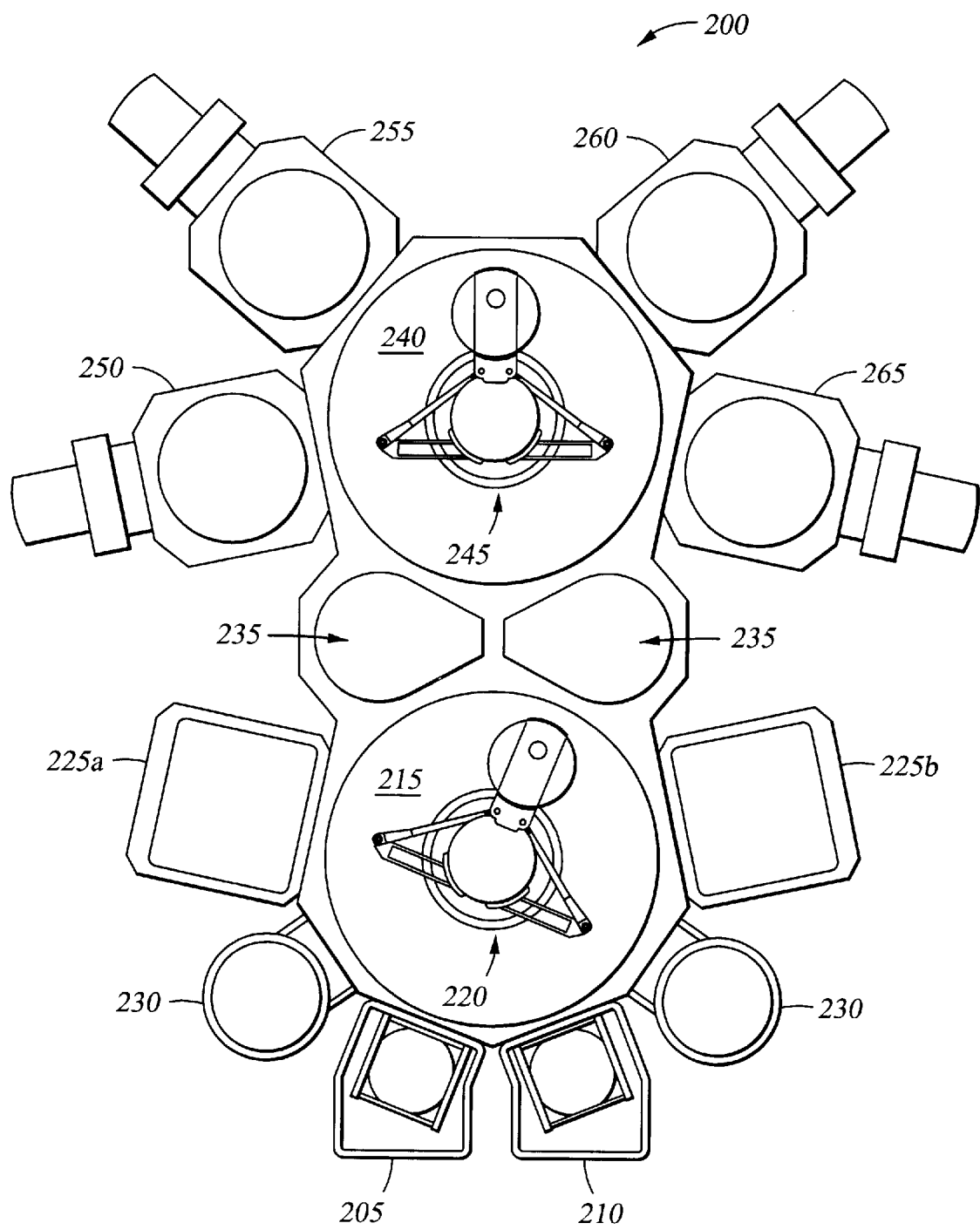
FIG. 9 is a schematic plan view of one embodiment of a cluster tool system having multiple substrate processing chambers.

All processing steps can be configured to occur on a cluster tool system having multiple substrate processing chambers, such as an Endura platform available from Applied Materials, Inc. of Santa Clara, Calif. FIG. 9 is a schematic view of a cluster tool system having multiple substrate processing chambers. The cluster tool system 200 includes vacuum load-lock chambers 205 and 210 attached to a first stage transfer chamber 215. The load-lock chambers 205 and 210 maintain vacuum conditions within the first stage transfer chamber 215 while substrates enter and exit system 200. A first robot 220 transfers substrates between the load-lock chambers 205 and 210 and one or more substrate processing chambers 225 and 230 attached to the first stage transfer chamber 215. Processing chambers 225 and 230 can be outfitted to perform a number of substrate processing operations such as chemical vapor deposition (CVD), physical vapor deposition (PVD), etch, pre-clean, degas, orientation, anneal and other substrate processes. The first robot 220 also transfers substrates to/from one or more transfer chambers 235 disposed between the first stage transfer chamber 215 and a second stage transfer chamber 240.

The transfer chambers 235 are used to maintain ultrahigh vacuum conditions in the second stage transfer chamber 240 while allowing substrates to be transferred between the first stage transfer chamber 215 and the second stage transfer chamber 240. A second robot 245 transfers substrates between the transfer chambers 235 and a plurality of substrate processing chambers 250, 255, 260 and 265. Similar to processing chambers 225 and 230, the processing chambers 250 to 265 can be outfitted to perform a variety of substrate processing operations. For example, for the cluster tool system 200 adapted to deposit a cobalt metal film of the present invention, the chamber may be adapted as follows. The processing chambers 230 may be degas/orientation chambers. Chamber 225a may be a pre-clean chamber. Chambers 250 and 255 may be both PVD chambers outfitted to deposited a cobalt film at high temperatures in order to increase the throughput of substrates through the system 200. Chamber 260 may be a PVD chamber outfitted to deposited a Ti/TiN capping layer. Chamber 235 may be a cooldown chamber. Chamber 265 and 225b may be optional chambers. The above listed sequence arrangement of the processing chambers is useful for practicing the present invention. The above-described cluster tool system is mainly for illustrative purposes. A plurality of cluster tool systems may be required to perform all of the processes required to complete manufacturing of an integrated circuit or chip. While foregoing is directed to the preferred embodiment of the present invention, other and further embodiments of the invention may be devised without departing from the basic scope thereof, and the scope thereof is determined by the claims that follow.

What is claimed is:

1. A method of forming a feature on a substrate, comprising:
   forming a gate structure over the substrate;
   forming a spacer by the sidewalls of the gate structure;
   depositing a metal film over the gate structure, spacer, and substrate, wherein the metal film is selected from the group which includes cobalt, titanium, molybdenum, palladium, platinum, tantalum, tungsten, and combinations thereof; and
   maintaining the substrate at a temperature greater than about 350° C. during the deposition of the metal film.

2. The method of claim 1, wherein depositing the metal film comprises depositing the metal film to a thickness between about 90 Angstroms to about 185 Angstroms.

3. The method of claim 1, wherein depositing the metal film comprises depositing the metal film to a thickness between about 50 Angstroms to about 150 Angstroms.

4. The method of claim 1, wherein maintaining the substrate comprises maintaining the substrate at a temperature greater than about 400° C.

5. The method of claim 1, wherein depositing the metal film comprises depositing the metal film by physical vapor deposition.

6. The method of claim 1, wherein depositing the metal film comprises applying a power between about 300 Watts and about 800 Watts to a metal target.

7. The method of claim 1, wherein the metal film comprises a cobalt film.

8. The method of claim 1, wherein the metal film comprises a titanium film.

9. The method of claim 1, further comprising conducting a first anneal of the substrate.

10. The method of claim 9, wherein conducting the first anneal comprises heating the substrate to a temperature between about 450° C. to about 500° C. for a time period between about 30 to about 60 seconds.

11. The method of claim 9, wherein conducting the first anneal comprises forming a silicide from the metal film.

12. The method of claim 11, further comprising etching the metal film which has not formed a silicide.

13. The method of claim 12, further comprising conducting a second anneal of the substrate.

14. The method of claim 13, wherein conducting the second anneal comprises heating the substrate to a temperature of at least about 700° C.

15. The method of claim 13, wherein the second anneal is conducted to reduce a resistivity of the silicide.

16. The method of claim 1, wherein maintaining the substrate at a temperature comprises heating the substrate using a heated pedestal adapted to provided a heated gas to the backside of the substrate.

17. The method of claim 1, wherein maintaining the substrate at a temperature comprising chucking the substrate using an electrostatic chuck.

18. The method of claim 9, further comprising depositing a capping layer over the metal film prior to conducting the first anneal.

19. The method of claim 18, further comprising, after conducting the first anneal, etching the capping layer and the metal film which has not formed a silicide.

20. The method of claim 1, wherein the metal film comprises cobalt and combinations thereof.

21. The method of claim 1, wherein the metal film comprises titanium and combinations thereof.

22. The method of claim 1, wherein maintaining the substrate comprises maintaining the substrate at a temperature greater than about 450° C.

23. The method of claim 1, wherein maintaining the substrate comprises maintaining the substrate at a temperature greater than about 500° C.

24. The method of claim 1, wherein the substrate is maintained at a temperature greater than about 350° C. to cause the metal film to agglomerate over the spacer.

25. A method of forming a feature on a substrate, comprising:
   forming a gate structure on the substrate;
   forming a spacer by the sidewalls of the gate structure;
   forming a source and a drain region between the gate structure;

depositing a continuous cobalt metal film over the gate structure and over the source and the drain region and a discontinuous cobalt metal film over the spacer;

conducting a first anneal of the substrate to form a cobalt silicide; and etching the cobalt metal film which has not formed a cobalt silicide.

26. The method of claim 25, wherein depositing the continuous cobalt metal film comprises depositing the continuous cobalt film to a thickness between about 90 Angstroms to about 185 Angstroms.

27. The method of claim 25, wherein depositing the continuous cobalt metal film comprises depositing the continuous cobalt metal film to a thickness between about 50 Angstroms to about 150 Angstroms.

28. The method of claim 25, wherein depositing the discontinuous cobalt metal film over the spacer comprises maintaining the substrate at a temperature greater than about 350° C. during the deposition of the metal film.

29. The method of claim 25, wherein depositing the discontinuous cobalt metal film over the spacer comprises maintaining the substrate at a temperature greater than about 400° C. during the deposition of the metal film.

30. The method of claim 25, where depositing the continuous cobalt metal film and the discontinuous cobalt metal film comprises depositing the continuous cobalt metal film and the discontinuous cobalt metal film by physical vapor deposition.

31. The method of claim 25, further comprising conducting a second anneal of the substrate to reduce a resistivity of the silicide.

32. The method of claim 25, further comprising depositing a capping layer over the metal film prior to conducting the first anneal.

33. The method of claim 32, further comprising etching the capping layer and the metal film which has not formed a silicide.

* * * * *